(12) United States Patent
Bessy et al.

(10) Patent No.: US 6,180,291 B1
(45) Date of Patent: Jan. 30, 2001

(54) STATIC RESISTANT RETICLE

(75) Inventors: Andrew Bessy, South Burlington, VT (US); James P. Doyle, Bronx, NY (US); Vaughn P. Gross, St. Albans, VT (US); C. Richard Guarnieri, Somers, NY (US); Rick J. Heh, Underhill; Kenneth D. Murray, Huntington, both of VT (US); James L. Speidell, Poughquag, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/235,254

(22) Filed: Jan. 22, 1999

(51) Int. Cl.$^7$ ........................................................ G03F 9/00
(52) U.S. Cl. .................................................................. 430/5
(58) Field of Search ................................ 430/5, 322, 324; 428/698

(56) References Cited

U.S. PATENT DOCUMENTS

| | | | |
|---|---|---|---|
| 3,949,131 | * | 4/1976 | Fraser .................................... 428/201 |
| 4,139,443 | * | 2/1979 | Sakurai ............................ 204/192.29 |
| 4,411,972 | * | 10/1983 | Narken et al. ............................ 430/5 |
| 4,440,841 | * | 4/1984 | Tabuchi ..................................... 430/5 |
| 5,403,683 | * | 4/1995 | Ohta et al. ................................ 430/5 |
| 5,521,031 | * | 5/1996 | Tennant et al. ........................... 430/5 |
| 6,027,815 | * | 2/2000 | Hsu .......................................... 430/5 |

FOREIGN PATENT DOCUMENTS

| | | | |
|---|---|---|---|
| 59-084244 | * | 5/1984 | (JP) . |
| 4039660 | * | 2/1992 | (JP) . |
| 6102656 | * | 4/1994 | (JP) . |
| 7020625 | * | 1/1995 | (JP) . |
| 7191451 | * | 7/1995 | (JP) . |
| 7261375 | * | 10/1995 | (JP) . |

* cited by examiner

Primary Examiner—S. Rosasco
(74) Attorney, Agent, or Firm—DeLio & Peterson, LLC; Peter W. Peterson; Howard J. Walter, Jr.

(57) ABSTRACT

A static resistant reticle for use in photolithography having optimal transmission and reduced electrostatic discharge. The reticle comprises a substrate, a patterning layer, and two layers of material having a first refractive index and a second refractive index wherein the first refractive index is greater than the second refractive index and at least one of the layers is conductive. The refractive indices and thickness of the layers are matched to create an anti-reflective coating. The anti-reflective coating optimizes transmission of light through the reticle substrate to about 98.0% to about 99.5% at a wavelength of about 360 nm to about 370 nm. The conductivity of at least one of the layers reduces electrostatic discharge further improving delineation of the pattern projected onto a silicon wafer of a semiconductor device. Preferably, the anti-reflective coating comprises two or more layers of cermet material. The layer of material having a first refractive index is most preferably ruthenium oxide or ruthenium oxide with alumina. The second layer of material having a second refractive index is most preferably silica. A method of fabricating a static resistant reticle, and a method of patterning a silicon wafer using the reticle of the present invention is also described.

64 Claims, 3 Drawing Sheets

STATIC RESISTANT RETICLE

BACKGROUND OF THE INVENTION

1. Field of the Invention

This invention relates in general to an apparatus used in the fabrication of semiconductor devices, and more specifically, to a reticle used in the manufacture of semiconductor devices employing photolithography.

2. Description of Related Art

The use of lithographic technology in transferring patterns from photomasks to semiconductor substrates in the fabrication of semiconductor devices, such as integrated circuits, has been highly developed and widely used. Reticles, or photomasks, are used with a variety of radiation sources, both visible and ultraviolet, as well as x-rays and electron beams.

A typical reticle comprises a transparent substrate, such as glass, quartz and the like, which is coated with a masking layer patterned to be complementary to the pattern desired to be transferred to a silicon wafer. Such masking layers are generally materials such as chromium, chrome oxide, iron oxide, nickel and the like. These materials are deposited on the substrate by conventional techniques known in the art.

In photolithography, transmission of light through the substrate of the reticle is about 96.0%. Thus, about 4% of the light is reflected at the interface of the substrate facing the silicon wafer and the air. Light passing through the substrate and hitting the masking layer is completely reflected at the substrate/mask interface. The 4% inherent reflectance of the reticle at the substrate/air interface increases the exposure time to pattern the silicon wafer leading to slower production and increased cost per wafer.

The glass substrate will typically become statically charged during handling. Even the smallest amount of static charge will attract dust and particles to the glass surface further degrading the circuit pattern projected on to the semiconductor substrate.

Static electricity due to the motion of objects or air around the reticles builds up on the reticles. Electrostatic discharge (ESD) results when the opposite charge between objects reaches a threshold, and the charge is passed between the objects. Depending on the degree of charge and an object's material sensitivity, the exchange of charge can cause damage to the object. In the case of very small mask photolithographic design structures, such as reticles, this damage can be severe enough to melt and/or blast the chrome structure. This causes mask damage including opens, re-deposited chrome, and severed geometries. The damage results in wafer scrap, rework, mask repair and rebuild, and considerable engineering and manufacturing time spent on in-line inspections and defect analysis.

Bearing in mind the problems and deficiencies of the prior art, it is therefore an object of the present invention to provide a reticle having reduced inherent reflectance improving the transmission of light when transferring the pattern onto a semiconductor substrate.

It is another object of the present invention to provide a reticle having optimal transmission and reduced ESD.

A further object of the invention is to provide a method of fabricating a static resistant reticle having optimal transmission and reduced ESD.

It is yet another object of the present invention to provide a method of patterning a silicon wafer in a semiconductor device with enhanced transmission of light and reduced ESD providing enhanced clarity of the reticle pattern.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a static resistant reticle using a patterning layer having optimal transmission for use in integrated circuit lithographic processes. The reticle comprises a transparent substrate, a layer of material having a first refractive index disposed over the substrate; and a layer of material having a second refractive index disposed over the layer of material having a first refractive index, wherein the first refractive index is greater than the second refractive index.

The reticle further includes a patterning layer employing a light blocking material having a desired pattern for the reticle. The patterning layer material can be selected from the group consisting of chromium, chrome oxide, copper, steel, and epoxy.

Positioning of the patterning layer may be either between the substrate and the layer of material having a first refractive index or between the layer of material having a first refractive index and the layer of material having a second refractive index wherein the layer of material having a first refractive index is disposed on the substrate. The latter positioning of the patterning layer may allow the layer of material having a first refractive index to be imbedded into the surface of the substrate wherein the upper surface of the layer of material having a first refractive index is co-planar with an upper surface of the substrate. Also, the layer of material having a first refractive index may act as an etch stop for the patterning layer in this latter position of the patterning layer.

In order to reduce the ESD damage and static charge, either one of the layers of material having a refractive index must be conductive. To further reduce ESD damage and static charge a grounding strap may extend from the conductive layer. Conductivity of at least one of the layers is adapted to reduce reticle charging during lithography. Preferably, either one or both of the layers may comprise cermet material.

The layer of material having a first refractive index is selected from the group consisting of ruthenium oxide, ruthenium oxide with alumina, indium tin oxide, indium tin oxide with alumina, and nitrogen doped ruthenium oxide. Most preferably, the layer of material having a first refractive index is ruthenium oxide. The layer of material having a second refractive index is silica.

The layer of material having a first refractive index and the layer of material having a second refractive index is adapted to be an anti-reflective coating on the reticle of the present invention wherein transmission of light is enhanced during lithographic processes. The transmission of light through the reticle is, preferably, in the range of about 98.0% to about 99.5%.

In another aspect, the present invention relates to a reticle for use in lithographic processes comprising a transparent substrate, a patterned masking layer disposed on the substrate, a layer of material having a first refractive index disposed on the masking layer, and a layer of material having a second refractive index disposed on the layer of material having a first refractive index wherein at least one of the layers is conductive to reduce ESD, and the layers together comprise an anti-reflective coating on the reticle to enhance transmission of light.

In yet another aspect, the present invention relates to a reticle for use in lithographic processes comprising a transparent substrate, a layer of material having a first refractive index disposed on the substrate, a patterned masking layer disposed on the layer of material having a first refractive index, and a layer of material having a second refractive index disposed on the masking layer wherein at least one of the layers is conductive to reduce ESD, and the layers together comprise an anti-reflective coating on the reticle enhancing transmission of light.

In both preferred embodiments of a reticle for use in lithographic processes, the layer of material having a first refractive index comprises, preferably, cermet material, most preferably, ruthenium oxide having a thickness of about 50 Å to about 1000 Å. Even more preferably, the ruthenium oxide further includes a layer of alumina having a thickness of about 100 Å to about 1000 Å. Preferably, the layer of material having a second refractive index comprises cermet material, most preferably silicon dioxide having a thickness of about 100 Å to about 1000 Å. Preferably, the transmission of light during lithographic processes is about 98.0% to about 99.5% at a wavelength of about 360 nm to about 370 nm.

In still yet another aspect, the present invention relates to a method of fabricating a static resistant reticle having optimal transmission comprising the steps of providing a transparent substrate; depositing a layer of material having a first refractive index on the substrate; and depositing a layer of material having a second refractive index over the layer of material having a first refractive index, wherein the first refractive index is greater than the second refractive index. Preferably, either of both layers of material having refractive indices comprise cermet material.

The method may further include the steps of depositing a layer of material having a first refractive index which is conductive or a layer of material having a second refractive index which is conductive, and extending a grounding strap from the conductive layer.

Furthermore, the steps of depositing a masking layer and patterning the masking layer may be included in the method of the present invention. This step may occur before or after the step of depositing the layer of material having a first refractive index and followed by the step of depositing a layer of material having a second refractive index. The masking layer is preferably material selected from the group consisting of chromium, chrome oxide, copper, steel, and epoxy. The layer of material having a first refractive index is preferably selected from the group consisting of ruthenium oxide, ruthenium oxide with alumina, indium tin oxide, indium tin oxide with alumina, and nitrogen doped ruthenium oxide. Most preferably, the layer of material having a first refractive index is ruthenium oxide. Preferably, the layer of material having a second refractive index is silica.

In one embodiment of the present aspect of the invention, the top coat method, the patterned light blocking layer is deposited on the substrate of the patterned reticle followed by depositing the layer of material having a first refractive index over the patterned light blocking layer, and followed by depositing the layer of material having a second index of refraction over the layer of material having a first refractive index.

In another embodiment of the present aspect of the invention, the undercoat method, the patterned reticle further includes depositing the patterned light blocking layer over the layer of material having a first refractive index, wherein the layer of material having a first refractive index is deposited over the substrate, and the layer of material having a second refractive index is deposited over the patterned light blocking layer. Optimally, the layer of material having a first refractive index is deposited over the substrate is adapted to be an etch stop during the step of depositing and patterning the masking layer.

In still a further aspect, the present invention relates to a method of patterning a silicon wafer in a semiconductor device comprising the steps of providing a silicon wafer having a resist layer and providing a patterned reticle using a patterned light blocking layer comprising a transparent substrate, a layer of material having a first refractive index disposed over the substrate, a layer of material having a second refractive index disposed over the layer of material having a first refractive index, wherein the first refractive index is greater than the second refractive index and at least one of the layers is conductive. The method then includes the steps of illuminating the reticle to produce an image of the patterned reticle; projecting the image of the reticle onto the silicon wafer; and patterning the resist layer on the silicon wafer. The layer of material having a first refractive index and the layer of material having a second refractive index comprise an anti-reflective coating on the reticle enhancing transmission of light when projecting the image of the reticle onto the silicon wafer, and the conductivity of at least one of the layers of the reticle reduces electrostatic charge of the reticle enhancing the clarity of the image projected onto the silicon wafer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a vertical cross-sectional view of a portion of a reticle prior to patterning of the masking layer.

FIG. 2 is a vertical cross-sectional view of a portion of a reticle where the masking layer is patterned and etched.

FIG. 3 is a vertical cross-sectional view of a portion of a reticle after deposition of the layer of material having a first refractive index according to the top coat method.

FIG. 4 is a vertical cross-sectional view of a portion of a reticle after deposition of the layer of material having a second refractive index which completes the anti-reflective coating according to the top coat method.

FIG. 5 is a vertical cross-sectional view of a portion of a reticle according to the top coat method further including a grounding strap extending from the layer of material having a first refractive index.

FIG. 6 is a vertical cross-sectional view of a portion of a reticle where the masking layer is deposited over an undercoat of the layer of material having a first refractive index according to the undercoat method of the present invention.

FIG. 7 is a vertical cross-sectional view of a portion of a reticle where the masking layer is patterned and etched.

FIG. 8 is a vertical cross-sectional view of a portion of a reticle after deposition of the layer of material having a second refractive index according to the undercoat method.

FIG. 9 is a vertical cross-sectional view of a portion of a reticle according to the undercoat method further including a grounding strap extending from the layer of material having a first refractive index.

DESCRIPTION OF THE PREFERRED EMBODIMENTS(S)

Figure 1:
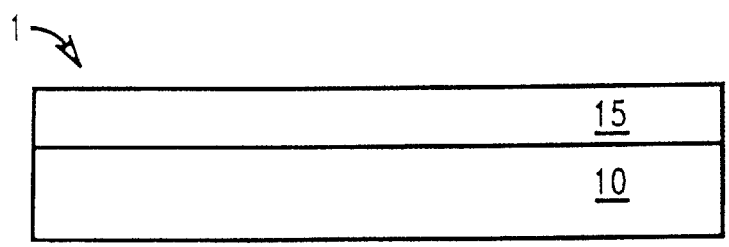
FIGS. 1–5 show the top coat method of making a preferred embodiment of the present invention wherein the two layers having a refractive index are disposed over the masking layer.

In describing the preferred embodiment of the present invention, reference will be made herein to FIGS. 1–10 of the drawings in which like numerals refer to like features of the invention. Features of the invention are not necessarily shown to scale in the drawings.

Generally, the present invention provides an anti-reflective coating (ARC) which enhances transmission of light and reduces ESD during photolithography. The ARC may comprise of at least two dielectric layers, each layer having different refractive indices selected to optimize transmission of light, disposed on an optically transparent substrate comprising glass, soda lime glass, quartz or sapphire. The layers comprising the ARC may comprise cermet material, a semi-synthetic material consisting of a mixture of ceramic and metallic components, e.g., metal carbides, borides, oxides and silicides. For example, a cermet such as alumina ($Al_2O_3$) has small inclusions comprising grains of aluminum which further reduce ESD due to its conductivity through the inclusions to bleed charge off the particular layer. Other cermets comprising dielectric materials may have inclusions formed therein by conventional implantation or techniques such as plasma immersion implantation.

As the electrostatic charge builds up on isolated regions of the reticle, the electric field increases. The ARC layers which may be initially non-conducting become conducting due to the increased electric field. The conductivity of the ARC layers bleeds the charge off the isolated reticle region. In cases where a cermet comprises one or more of the layers of the ARC, the conduction mechanism can be thought of as a combination metallic transport through the inclusions and electron hopping between inclusions, particularly where the inclusions are metal grains.

Figure 2:
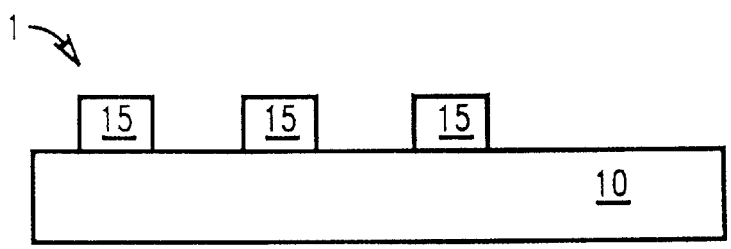

FIG. 1 shows a cross sectional view of a portion of a reticle 1 of the present invention according to the top coat method of making the reticle. The reticle as shown is prior to patterning of the masking layer. Substrate 10 is made of an optically transparent material such as soda lime glass, quartz, glass, or sapphire. The refractive index of the substrate is irrelevant to the present invention so long as it is optically transparent. A masking layer 15 is deposited over substrate 10. The masking layer 15 can be any material capable of blocking light such as chromium, chrome oxide, copper, steel, or epoxy. Most preferably, the masking layer is chrome deposited onto substrate 10 by any conventional means known in the art. In FIG. 2, masking layer 15 is patterned and etched.

Figure 3:
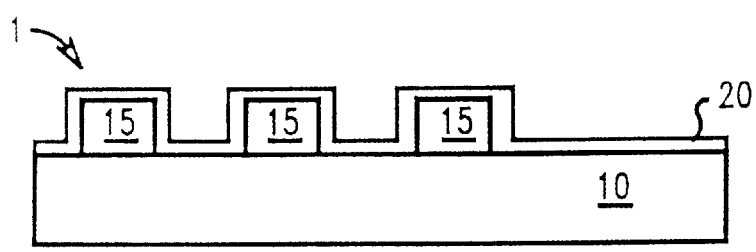

In FIG. 3, an optically transparent layer of material having a first refractive index 20 is then deposited over masking layer 15 conforming to the pattern of the masking layer. Preferably, the layer of material having a first refractive index is a cermet. More preferably, the layer of material having a first refractive index is selected from the group consisting of ruthenium oxide, ruthenium oxide with alumina, indium tin oxide, indium tin oxide with alumina, and nitrogen doped ruthenium oxide. Even more preferably, the layer of material having a first refractive index is ruthenium oxide having a thickness of about 50 Å to about 1000 Å with a layer of alumina having a thickness of about 100 Å to about 1000 Å. The layer of material having a first refractive index can be conductive with a grounding strap (as shown in FIG. 5) extending from the layer to further reduce ESD.

The layer of material having a first refractive index can be deposited onto the substrate by any conventional means known in the art. Deposition techniques known in the art determine the thickness and the refractive index of the layers. Preferred refractive indices are in the range of about 1.6 to about 2.2.

Figure 4:
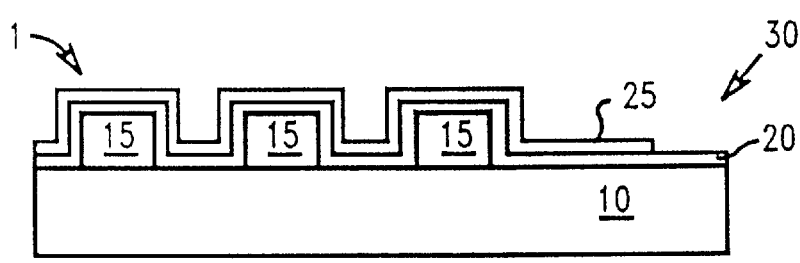

FIG. 4 shows continued processing of the reticle where a layer of material having a second refractive index 25 is then deposited over the layer of material having a first refractive index 20. The edge of reticle 1 has a small region 30 where the layer of material having a first refractive index 20 is not covered by the layer of material having a second refractive index 25. The second refractive index must be lower than the first refractive index and that layer can also be conductive. The refractive index of the layer of material having a second refractive index is preferably in the range of about 1.0 to about 1.2. Preferably, the layer of material having a second refractive index comprises cermet material, most preferably, silica having a thickness of about 100 Å to about 1000 Å. The silica layer is used as a final top coat for the reticle.

Figure 5:
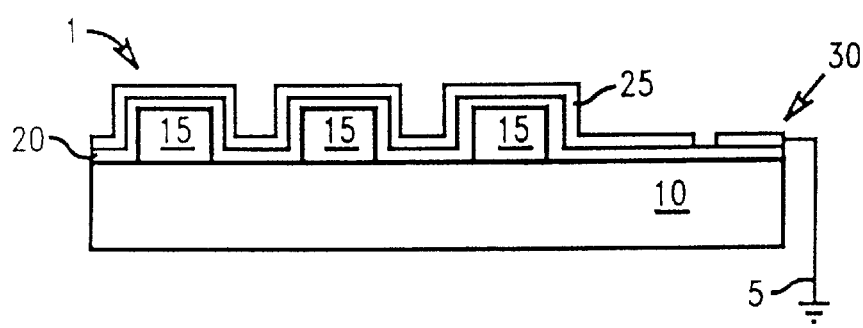

FIG. 5 shows how a grounding strap 5 may be attached to the reticle to further reduce ESD. The grounding strap is, preferably, a copper aluminum alloy attached by conventional methods known in the art. In FIG. 5, grounding strap 5 is attached at region 30 to the conductive layer of material having a first refractive index 20 which is not covered by the layer of material having a second refractive index 25. Alternatively, the grounding strap may also be attached to the layer of material having a second refractive index if that layer is conductive.

Figure 6:
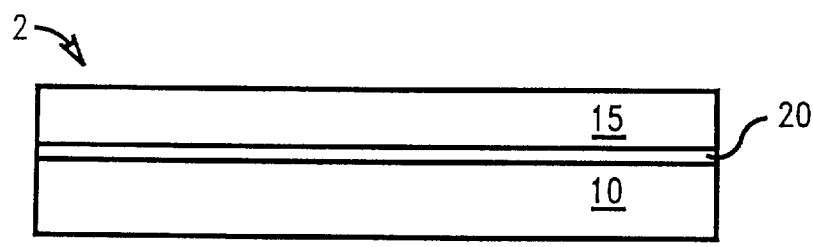
FIGS. 6–9 show the undercoat method of producing a preferred embodiment of the present invention wherein the masking layer is disposed between the layers of material having a refractive index.
Figure 6A:
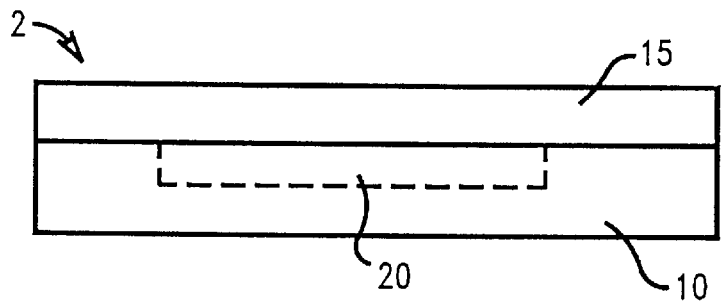
Figure 7:
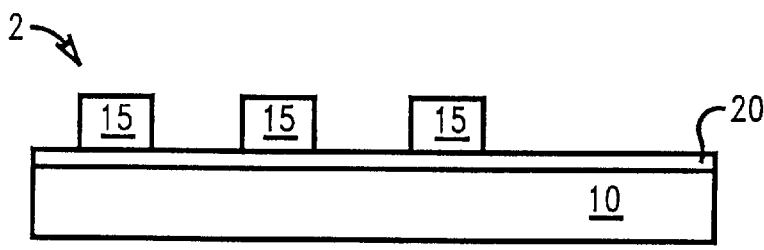

FIGS. 6 to 9 show a cross sectional view of a portion of a reticle 2 of the present invention according to the undercoat method of making the reticle. In FIG. 6, the layer of material having a first refractive index 20 is deposited over substrate 10. Alternatively, the layer of material having a first refractive index 20 may be imbedded into substrate 10 as shown in FIG. 6A. Masking layer 15 is deposited onto the layer of material having a first refractive index 20. FIG. 7 shows the masking layer patterned and etched as desired. Optimally, the layer of material having a first refractive index 20 may act as an etch stop during etching of the masking layer 15.

Figure 8:
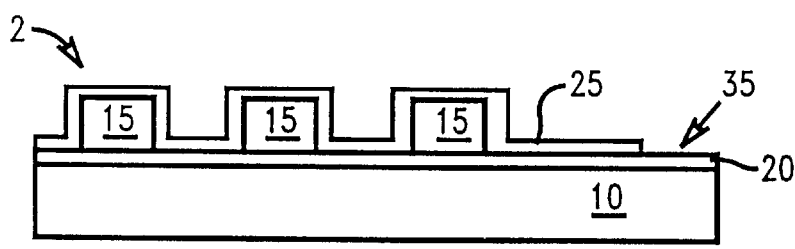
Figure 9:
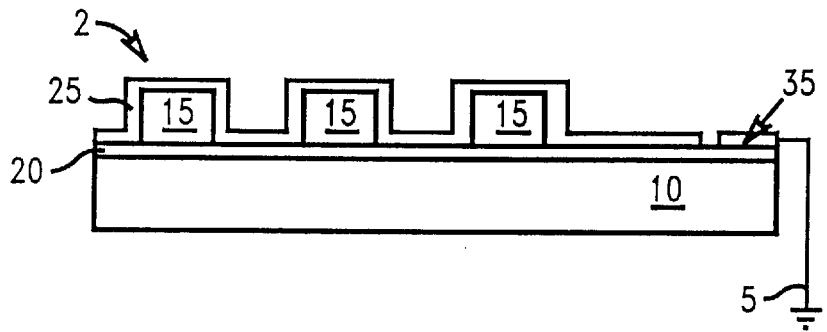

FIG. 8 shows continued processing of reticle 2 by depositing the layer of material having a second refractive index 25 thereover. Again there is a region 35 where layer 25 does not cover layer 20. Grounding strap 5 is attached to the conductive layer of material having a first refractive index 20 at region 35 as shown in FIG. 9. Alternatively, the grounding strap may also be attached to the layer of material having a second refractive index if that layer is conductive.

Figure 10:
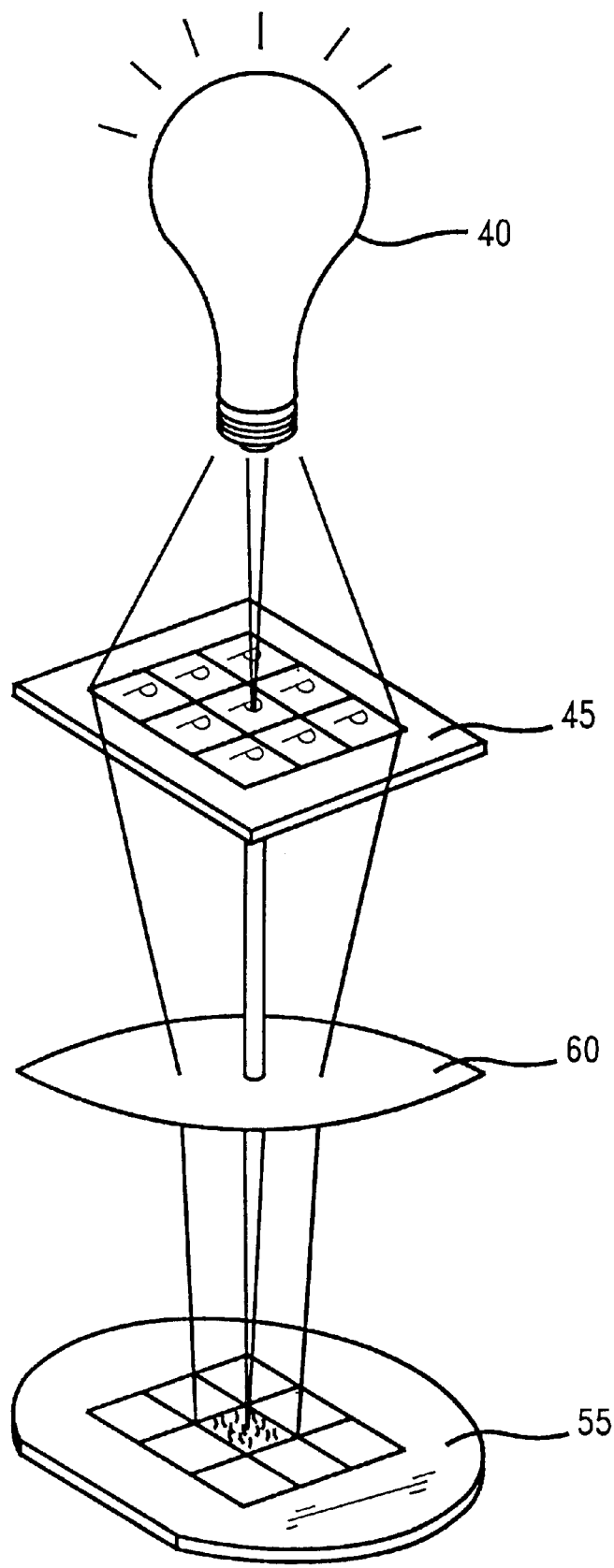
FIG. 10 is a perspective view of how the reticle of the present invention is used to transfer the pattern of the reticle onto a silicon wafer during photolithography.

FIG. 10 shows a simplified schematic view of how a silicon wafer is patterned using the reticle 45 of the present invention. A light source 40 is used to emit light at a wavelength of about 360 nm to about 370 nm. The light transfers an image of the entire reticle 45, or a portion thereof, having the desired patterned onto a silicon wafer having a resist layer. The image of the reticle is reduced through the reduction projection lens 60 to fit onto the entire silicon wafer or a portion thereof. The resist layer of the silicon wafer is patterned with the reticle pattern.

The transmission of light through the reticle is a function of five variables: the wavelength of light, the refractive index and thickness of the layer of material having a first refractive index, and the refractive index and thickness of the layer of material having a second refractive index. The above variables are optimized in the preferred embodiments of the present invention to enhance transmission of light through the reticle to the range of about 98.0% to about 99.5%. However, the reticle thickness, the refractive index of the materials, and the materials themselves, can be varied to give optimal transmission at any wavelength.

The above invention achieves the objects recited above. The layer of material having a first refractive index and the layer of material having a second refractive index, wherein the first refractive index is greater than the second refractive index, are matched with regard to their indices of refraction and thicknesses at the exposure wavelength, to optimize transmission and minimize reflectance. The two layers comprise an anti-reflective coating on the reticle improving transmission when projecting the image of the pattern onto a silicon wafer of a semiconductor device.

The conductivity of at least one of the layers serves to reduce ESD minimizing damage to the reticle. Delineation of the pattern when projecting the image is also improved since static charge is reduced and fewer particles are attracted to the reticle. A grounding strap extending from the conductive layer also aids in decreasing static charge.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A static resistant reticle for use in integrated circuit lithographic processes comprising:
   a transparent substrate;
   a first layer of material having a first refractive index disposed over said substrate; and
   a second layer of material having a second refractive index disposed over said layer of material having a first refractive index, said first refractive index being greater than the second refractive index,
   one or more of the first or second layers comprising a cermet material capable of being conductive when exposed to an increased electric field due to build-up of electrostatic charge during lithographic processing.

2. A static resistant reticle according to claim 1, further including a patterning layer.

3. A static resistant reticle according to claim 2, wherein said patterning layer employs a light blocking material having a desired pattern for said reticle.

4. A static resistant reticle according to claim 2, wherein said patterning layer is selected from the group consisting of chromium, chrome oxide, copper, steel, and epoxy.

5. A static resistant reticle according to claim 2, wherein said patterning layer is disposed on said transparent substrate, said layer of material having a first refractive index is disposed over said patterning layer, and said layer of material having a second index of refraction is disposed over said layer of material having a first refractive index.

6. A static resistant reticle according to claim 2, wherein said layer of material having a first refractive index is disposed on said substrate, said patterning layer is disposed on said layer of material having a first refractive index, and said layer of material having a second refractive index is disposed on said patterning layer.

7. A static resistant reticle according to claim 6, wherein said layer of material having a first refractive index is adapted to be an etch stop for said patterning layer.

8. A static resistant reticle according to claim 1, wherein said layer of material having a first refractive index comprises cermet material.

9. A static resistant reticle according to claim 1, further including a grounding strap extending from said layer of material having a first refractive index.

10. A static resistant reticle according to claim 1, wherein said layer of material having a second refractive index comprises cermet material.

11. A static resistant reticle according to claim 1, further icluding a grounding strap extending from said layer of material having a second refractive index.

12. A static resistant reticle according to claim 1, wherein said layer of material having a first refractive index is imbedded into the surface of said substrate wherein an upper surface of said layer of material having a first refractive index is co-planar with an upper surface of said substrate.

13. A static resistant reticle according to claim 1, wherein said layer of material having a first refractive index is selected from the group consisting of ruthenium oxide, ruthenium oxide with alumina, indium tin oxide, indium tin oxide with alumina, and nitrogen doped ruthenium oxide.

14. A static resistant reticle according to claim 1, wherein said layer of material having a first refractive index is ruthenium oxide.

15. A static resistant reticle according to claim 1, wherein said layer of material having a second refractive index is silica.

16. A static resistant reticle according to claim 1, wherein said layer of material having a first refractive index and said layer of material having a second refractive index is an anti-reflective coating on said reticle wherein transmission of light is enhanced during lithographic processes.

17. A static resistant reticle according to claim 1, wherein the transmission of light through said reticle is in the range of about 98.0% to about 99.5%.

18. A reticle for use in lithographic processes comprising:
   a transparent substrate;
   a patterned masking layer disposed on said substrate;
   a layer of material having a first refractive index disposed on said patterned masking layer; and
   a layer of material having a second refractive index disposed on said layer of material having a first refractive index,
   at least one of said layers comprising a cermet material capable of being conductive when exposed to an increased electric field, due to build-up of electrostatic charge during lithographic processing, said layers further comprising an anti-reflective coating on said reticle enhancing transmission of light.

19. A reticle according to claim 18, wherein said layer of material having a first refractive index comprises cermet material.

20. A reticle according to claim 18, wherein said layer of material having a first refractive index is ruthenium oxide.

21. A reticle according to claim 20, wherein said layer of ruthenium oxide h as a thickness of about 50 Å to 1000 Å.

22. A reticle according to claim 21, further including a layer of alumina having a thickness of about 100 Å to 1000 Å.

23. A reticle according to claim 18, wherein said layer of material having a second refractive index comprises cermet material.

24. A reticle according to claim 18, wherein said layer of material having a second refractive index is silicon dioxide.

25. A reticle according to claim 24, wherein said layer of silicon dioxide is about 100 Å to 1000 Å.

26. A reticle according to claim 18, wherein the transmission of light during lithographic processes is about 98.0% to 99.5% at a wavelength of about 360 nm to 370 nm.

27. A reticle for use in lithographic processes comprising:
a transparent substrate;
a layer of material having a first refractive index disposed on said substrate; and
a patterned masking layer disposed on said layer of material having a first refractive index;
a layer of material having a second refractive index disposed on said patterned masking layer,
at least one of said layers comprising a cermet material capable of being conductive when exposed to an increased electric field, due to build-up of electrostatic charge during lithographic processing, said layers further comprising an anti-reflective coating on said reticle enhancing transmission of light.

28. A reticle according to claim 27, wherein said layer of material having a first refractive index comprises cermet material.

29. A reticle according to claim 27, wherein said layer of material having a first refractive index is ruthenium oxide.

30. A reticle according to claim 29, wherein said layer of ruthenium oxide has a thickness of about 50 Å to 1000 Å.

31. A reticle according to claim 27, further including a layer of alumina having a thickness of about 100 Å to 1000 Å.

32. A reticle according to claim 27, wherein said layer of material having a second refractive index comprises cermet material.

33. A reticle according to claim 27, wherein said layer of material having a second refractive index is silicon dioxide.

34. A reticle according to claim 33, wherein said layer of silicon dioxide has a thickness of about 100 Å to 1000 Å.

35. A reticle according to claim 27, wherein the transmission of light during lithographic processes is about 98.0% to 99.5% at a wavelength of about 360 nm to 370 nm.

36. A method of fabricating a static resistant reticle having optimal transmission comprising the steps of:
(a) providing a transparent substrate;
(b) depositing a layer of material having a first refractive index on said substrate; and
(c) depositing a layer of material having a second refractive index over said layer of material having a first refractive index,
the first refractive index being greater than the second refractive index and at least one of said layers comprising a cermet material capable of being conductive when exposed to an increased electric field due to build-up of electrostatic charge during lithographic processing.

37. A method according to claim 36, wherein step (b) comprises depositing a cermet material having a first refractive index.

38. A method according to claim 36, wherein step (b) comprises depositing a conductive layer of material having a first refractive index.

39. A method according to claim 38, further including the step of attaching a grounding strap extending from said layer of material having a first refractive index.

40. A method according to claim 36, wherein step (c) comprises depositing a cermet material having a second refractive index.

41. A method according to claim 36, wherein step (c) comprises depositing a conductive layer of material having a second refractive index.

42. A method according to claim 41, further including the step of attaching a grounding strap extending from said layer of material having a second refractive index.

43. A method according to claim 36, further including step (d) depositing a masking layer and patterning said masking layer.

44. A method according to claim 43, wherein in step (d) said masking layer is selected from the group consisting of chromium, chrome oxide, copper, steel, and epoxy.

45. A method according to claim 43, wherein after step (a), the steps are performed in the following sequence: step (d) followed by step (b), followed by step (c).

46. A method according to claim 43, wherein after step (a), the steps are performed in the following sequence: step (b) followed by step (d), followed by step (c).

47. A method according to claim 46, wherein said layer of material having a first refractive index is adapted to be an etch stop during step (d).

48. A method according to claim 36, wherein in step (b) said layer of material having a first refractive index is selected from the group consisting of ruthenium oxide, ruthenium oxide with alumina, indium tin oxide, indium tin oxide with alumina, and nitrogen doped ruthenium oxide.

49. A method according to claim 36, wherein in step (b) said layer of material having a first refractive index is ruthenium oxide.

50. A method according to claim 36, wherein deposited said layer of material having a second refractive index is silca.

51. A method of patterning a silicon wafer in a semiconductor device comprising the steps of:
(a) providing a silicon wafer having a resist layer;
(b) providing a patterned reticle using a patterned light blocking layer comprising:
(i) a transparent substrate;
(ii) a layer of material having a first refractive index disposed over said substrate;
(iii) a layer of material having a second refractive index disposed over said layer of material having a first refractive index; and
the first refractive index being greater than the second refractive index and at least one of said layers comprising a cermet material capable of being conductive when exposed to an increased electric field due to build-up of electrostatic charge during lithographic processing;
(c) illuminating said reticle to produce an image of said patterned reticle;
(d) projecting the image of said reticle onto said silicon wafer; and
(e) patterning the resist layer on said silicon wafer,
wherein said layer of material having a first refractive index and said layer of material having a second refractive index comprise an anti-reflective coating on said reticle enhancing transmission of light when projecting the image of said reticle onto said silicon wafer, and the conductivity of at least one of said layers of said reticle reduces electrostatic charge of said reticle enhancing the clarity of the image projected onto said silicon wafer.

52. A method according to claim 51, wherein in step (b), said patterned light blocking layer is disposed on said transparent substrate of said patterned reticle, said layer of material having a first refractive index is disposed over said patterned light blocking layer, and said layer of material having a second index of refraction is disposed over said layer of material having a first refractive index.

53. A method according to claim 51, wherein in step (b), said patterned light blocking layer is disposed over said layer of material having a first refractive index, wherein said layer of material having a first refractive index is disposed over said substrate, and said layer of material having a second refractive index is disposed over said patterned light blocking layer.

54. A static resistant reticle comprising:
a transparent substrate;
a layer of material having a first refractive index disposed over said substrate;
a patterned masking layer; and
a layer of material having a second refractive index greater than the first refractive index disposed over said patterned masking layer,
one of the layers of material comprising a cermet material capable of being conductive when exposed to an increased electric field due to build-up of electrostatic charge during lithographic processing.

55. The static resistant reticle of claim 54 wherein the layer of material adapted to be conductive has the first refractive index and is a cermet material having conductive inclusions therein.

56. The static resistant reticle of claim 54 wherein the layer of material adapted to be conductive has the a second refractive index and is a cermet material having conductive inclusions therein.

57. A reticle for use in lithographic processes comprising:
a transparent substrate;
a layer of material having a first refractive index disposed over said substrate;
a patterned masking layer;
a layer of material having a second refractive index greater than the first refractive index disposed over said patterned masking layer
one of the layers of material comprising a material capable of being conductive when exposed to an increased electric field due to build-up of electrostatic charge during lithographic processing; and
a grounding strap extending from said one of said layers.

58. The reticle of claim 57 wherein the layer of material capable of being conductive is the layer having the first refractive index, and wherein said grounding strap extends therefrom.

59. The reticle of claim 57 wherein the layer of material capable of being conductive is the layer having the second refractive index, and wherein said grounding strap extends therefrom.

60. A reticle for use in lithographic processes comprising;
a transparent substrate;
a layer of material having a first refractive index embedded into a top portion of said substrate such that a top surface of said layer of material is substantially co-planar with a top surface of said substrate;
a masking layer disposed over said layer of material having a first refractive index; and
a layer of material having a second refractive index less than the first refractive index disposed over the masking layer,
one of the layers of material comprising a material capable of being conductive when exposed to an increased electric field due to build-up of electrostatic charge during lithographic processing.

61. A reticle for use in lithographic processes comprising:
a transparent substrate;
a patterned masking layer;
at least a first layer of material adjacent the masking layer selected from the group consisting of ruthenium oxide, ruthenium oxide with alumina, indium tin oxide, indium tin oxide with alumina, and nitrogen doped ruthenium oxide, the first layer of material comprising a material capable of being conductive when exposed to an increased electric field due to build-up of electrostatic charge during lithographic processing; and
at least one layer of material having a lower refractive index than the at least first layer of material adjacent the first of masking layers and comprising a dielectric material, said substrate and layers of material having transmission of light of at least about 96%.

62. A method of fabricating a static resistant reticle having optimal transmission comprising the steps of:
(a) providing a transparent substrate;
(b) depositing a layer of material having a first refractive index on said substrate;
(c) depositing a masking layer over said layer of material having a first refractive index; and
(d) depositing a layer of material having a second refractive index over said masking layer,
wherein the first refractive index is greater than the second refractive index and at least one of said layers comprises cermet material capable of being conductive when exposed to an increased electric field due to build-up of electrostatic charge during lithographic processing.

63. The method of claim 62 wherein in step (b) said layer of material having a first refractive index is selected from the group consisting of ruthenium oxide, ruthenium oxide with alumina, indium tin oxide, indium tin oxide with alumina, and nitrogen doped ruthenium oxide, and wherein said substrate and layers of material have a transmission of light of at least about 96%.

64. A method of fabricating a static resistant reticle having optimal transmission comprising the steps of:
(a) providing a transparent substrate;
(b) embedding a layer of material having a first refractive index into a top surface of said transparent substrate such that a top surface of said layer of material is substantially co-planar with a top surface of said substrate;
(c) depositing and patterning a masking layer over said layer of material embedded into said transparent substrate; and
(d) depositing a layer of material having a second refractive index over said masking layer,
wherein the first refractive index is greater than the second refractive index and at least one of said layers comprises cermet material capable of being conductive when exposed to an increased electric field due to build-up of electrostatic charge during lithographic processing.

* * * * *